Oct. 11, 1966 B. TOPAS 3,278,347

HIGH VOLTAGE SEMICONDUCTOR DEVICE

Filed Nov. 26, 1963 2 Sheets-Sheet 1

INVENTOR.
BENJAMIN TOPAS

BY

OSTROLENK, FABER, GERB & SOFFEN
ATTORNEYS

HIGH VOLTAGE SEMICONDUCTOR DEVICE

Filed Nov. 26, 1963 2 Sheets-Sheet 2

INVENTOR.
BENJAMIN TOPAS

BY

OSTROLENK, FABER, GERB & SOFFEN

ATTORNEYS

3,278,347
HIGH VOLTAGE SEMICONDUCTOR DEVICE

Benjamin Topas, Santa Monica, Calif., assignor to International Rectifier Corporation, El Segundo, Calif., a corporation of California Filed Nov. 26, 1963, Ser. No. 325,873
3 Claims. (Cl. 148—33.2)

This invention relates to a novel controlled rectifier device, and more specifically relates to a novel controlled rectifier which has two diffused junctions and a third epitaxially formed junction therein whereby a new and novel device is formed which has bulk-avalanche voltage capabilities of the order of 1500 volts and higher.

Controlled rectifiers are well known to the art where such rectifiers have been manufactured in the past to have voltage capabilities which, at the maximum, have been 800 volts for current ratings of the order of 70 amperes (110 ampere R.M.S.).

The present invention relates to a novel controlled rectifier which may be of silicon or germanium having an improved novel construction and using improved novel manufacturing techniques to produce a totally new product which, for the first time, offers voltage capabilities up to 1500 volts. Moreover, it has been found that the novel controlled rectifier of the present invention has an exceptionally high *dV/dt* capability whereby the device may now be used in an extremely effective manner for inverter applications.

Prior to the novel invention, the highest voltage controlled rectifiers available to the industry have been made either through an all diffused process, or the combination of alloying and diffusing process.

The present invention provides a novel manner for combining a diffused process with an epitaxial deposition process which has led to a highly reproducible, extremely high yield process which is much more controllable than other methods heretofore used in manufacturing controlled rectifiers. Moreover, these novel methods are applicable in general to the formation of any high voltage junction.

The novel product which is formed in accordance with the invention for the first time makes the application of controlled rectifiers practical in the fields formerly occupied by ignitrons, thyratrons, and motor-generator sets. That is to say, the novel product of the invention, having the exceptionally high voltage capabilities, eliminates the problem earlier encountered when lower voltage controlled rectifiers had to be connected in series to achieve a given higher voltage rating required in various applications, thus resulting in complex firing and voltage division problems.

With the novel epitaxial-diffused controlled rectifier of the invention, a single unit will fill most high voltage requirements with increased reliability through bulk-avalanche characteristics in both the forward and reverse blocking directions.

Moreover, these units which have bulk-avalanche capabilities which can span the voltage range from 1000 to 1500 volts also provide extremely low leakage currents of the order of 500 microamperes at 25° C., and 1 milliampere at 125° C. prior to avalanche.

Accordingly, a primary object of this invention is to provide a novel controlled rectifier which has capabilities up to 1500 volts.

Another object of this invention is to provide a novel high voltage controlled rectifier which eliminates the need for the use of series connected, lower voltage rated, controlled rectifiers previously required in many applications.

A further object of this invention is to form a novel controlled rectifier with a highly reliable and reproducible manufacturing process.

Another object of this invention is to provide a novel controlled rectifier which uses both epitaxially formed and diffused junctions.

Yet another object of this invention is to provide a novel process for forming a multijunction device by epitaxially depositing additional junctions on wafers having diffused junctions therein.

These and other objects of this invention will become apparant from the following description when taken in connection with the drawings, in which.

Referring now to the figures, I have illustrated the invention for use in a controlled rectifier which could, for example, be a unit having a rating of 1500 volts in the forward and reverse direction for currents of the order of 70 amperes D.-C. The technique described herein, while of specific value in forming, for the first time, a unit of this capability, can also be used for the manufacture of any desired lower rating. For other ratings for the unit, various changes may be made in the manufacturing technique, as will be apparent to those skilled in the art.

Figure 2:
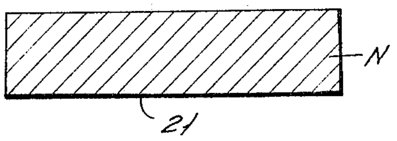
FIGURE 2 is a cross-sectional view of the wafer of FIGURE 1 taken across the lines 2—2 in FIGURE 1.
Figure 1:
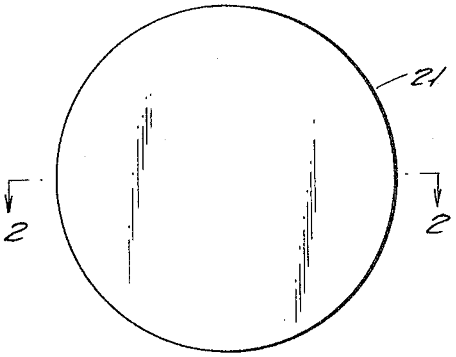
FIGURE 1 is a top view of a semiconductor wafer.

The process is started by saw-cutting a suitable wafer, as shown in FIGURES 1 and 2, from a monocrystalline N-type silicon ingot in the usual manner. Note that if the starting wafer were of the P-type the succeeding steps following would reverse the uses of N- and P-type material. For purposes of illustration, the wafer will have a diameter of 812 mils and a thickness of 15 mils. The wafer is then lapped down and etched to a thickness of approximately 14 mils with the N-type wafer having a resistivity of 50 ohm centimeters. The thickness and resistivity of the unit will depend upon the desired blocking voltage to be attained, the specific values given herein applying to the 1500 volt unit. It will, however, be noted that these particular values are not greatly critical and may be varied, as well known to those skilled in the art for any particular application.

After the preparation of the wafer of FIGURES 1 and 2, as indicated, the wafer is placed in a suitable diffusion chamber and is diffused according to well known prior art techniques with gallium in an argon ambient where the argon is at a pressure of 450 millimeters of mercury. This diffusion operation will cause the formation of a P-type layer 20 about the basic N-type body 21 of the wafer. The diffusion temperatures and times are then adequately controlled so that the diffusion will reach a depth of approximately 3½ mils into the N-type wafer 21. At the end of the diffusion operation, the surface resistance at the top of the wafer is approximately two ohm-centimeters.

Figure 3:
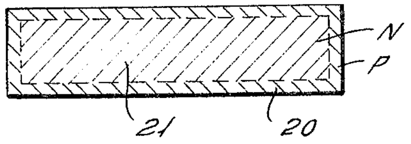
FIGURE 3 shows the wafer of FIGURE 2 after a first diffusion operation to form two of the junctions of the device.
Figure 5:
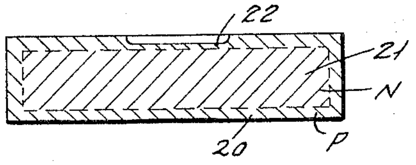
FIGURE 5 is a cross-sectional view of FIGURE 4 taken across the lines 5—5 in FIGURE 4.
Figure 4:
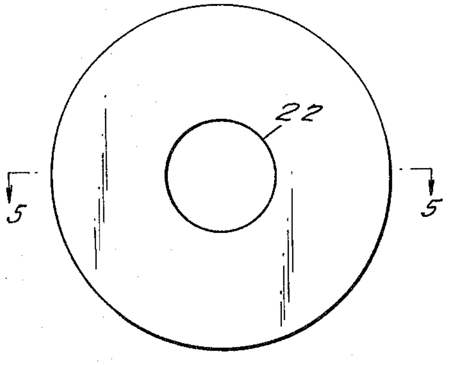
FIGURE 4 is a top view of the wafer of FIGURE 3 after the formation of a well in the upper surface thereof.

Thereafter, the wafer of FIGURE 3 is suitably masked with a circular opening left in the upper surface thereof and the assembly is then immersed in a suitable etching medium such as an HF, $HNO_3$, and acetic acid mixture in a 2:7=1 ratio at room temperature and a central well 22 is etched into the upper surface, as shown in FIGURES 4 and 5. The diameter of this well is approximately 0.35 inch and proceeds to a depth at which the surface resistance at the bottom of the well is approximately 20 ohm centimeters. It has been found that the depth of this well will be approximately 1½ mils before this value is attained.

Figure 6:
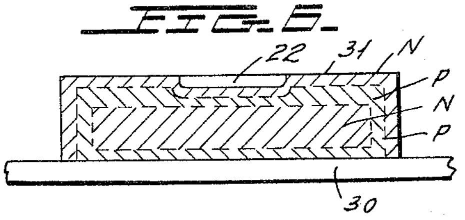
FIGURE 6 shows the wafer of FIGURE 5 positioned on a heater strip after the epitaxial deposition of silicon on the upper surface of the wafer of FIGURE 5.

The wafer of FIGURES 4 and 5 is thereafter suitably cleaned and placed into an epitaxial deposition apparatus, and an additional monocrystalline layer of silicon is epitaxially deposited into the well 22 and the other exposed surface portions of the wafer. Epitaxial deposition techniques are well known to those skilled in the art. In accordance with the invention, the wafer of FIGURES 4 and 5 having the two diffused junctions is placed into a typical epitaxial deposition apparatus and, for example, is seated upon a graphite strip heater 30, as illustrated in FIGURE 6 within a suitably sealed chamber (not shown) and the wafer temperature is elevated to a suitably high temperature. A mixture of silicon trichlorosilane, hydrogen gas, and gas containing a suitable N-type doping element such as $H_3P$ are then applied to the chamber in the usual manner and the hydrogen reduces the silicon trichlorosilane to deposit a monocrystalline silicon layer thereon on the wafer substrate. This deposit will include the N-type doping element so that the grown layer will be N-type silicon. Thus, an N-type layer 31 is grown around the exposed portions of the silicon wafer, as shown in FIGURE 6, as well as within well 22.

Figure 7:
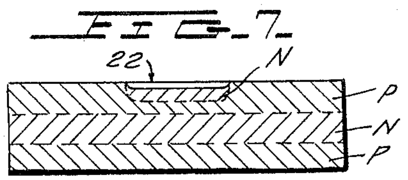
FIGURE 7 illustrates the wafer of FIGURE 6 after the edges have been removed and the top surface lapped.
Figure 9:
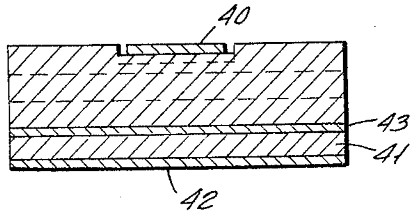
FIGURE 9 is a side cross-sectional view of FIGURE 8 taken across the lines 9—9 in FIGURE 8.
Figure 8:
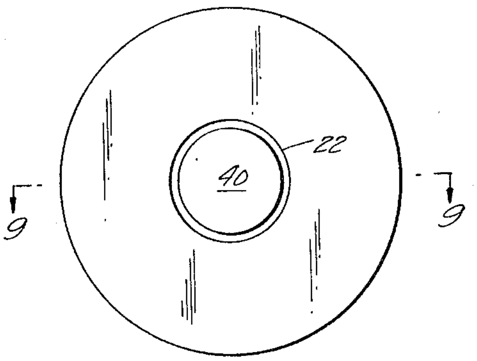
FIGURE 8 is a top view of the wafer of FIGURE 7 after an electrode is connected within the well.

After growing the epitaxial layer 31 to a thickness of approximately 1 to 2 mils, the wafer is suitably cut as by etching to remove the periphery of the wafer so that the various junctions extend to the edges of the wafer, as illustrated in FIGURE 7. More specifically, the wafer of FIGURE 6 is etch-cut to a diameter of approximately 700 mils by suitably masking the wafer and dipping it into an etching solution. Following this etch-cut operation, the upper surface of the wafer is lapped until the portions of N-type, epitaxially deposited, layer 31 external of well 22 are removed and the P-type material thereunder is exposed. Thus, the wafer as shown in FIGURE 7 will have an upper P-type surface within which an N-type epitaxially deposited layer is embedded. Thereafter, an ohmic contact 40 is formed on the N-type layer 31 of FIGURE 7 within the well 22. The diameter of contact 40 is small enough to be spaced from, and thus insulated from the surrounding P-type material. This ohmic contact 40 which ultimately forms the emitter electrode of the controlled rectifier to be formed can be formed of a leaf of gold having a thickness of the order of 1 mil which can contain, for example, a 1% impurity of antimony for wetting purposes during the alloying operation. A lower contact is then formed which includes a molybdenum disk 41 which could have a thickness, for example, of 40 mils which is previously alloyed to a lower silver wafer 42 which could have a thickness of 3 mils. This assembly is then alloyed to the bottom of the wafer through the use of a thin leaf 43 of a suitable aluminum silicon eutectic having a thickness, for example, of ½ mil. This assembly of members 40, 41, 42 and 43 may then be placed in a suitable jig and the assembly then placed in a furnace for alloying all of the various elements together in a manner well known to the art. Thus, the assembly may be held at a temperature of 880° C. for 30 minutes in an inert atmosphere such as nitrogen gas at atmospheric pressure.

Figure 11:
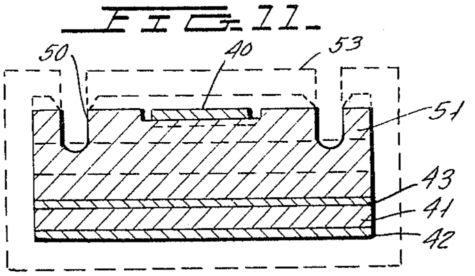
FIGURE 11 is a cross-sectional view of FIGURE 10 taken across the lines 11—11 in FIGURE 10, and additionally schematically illustrates the placement of masking means which could be used during the initial etching operation.
Figure 10:
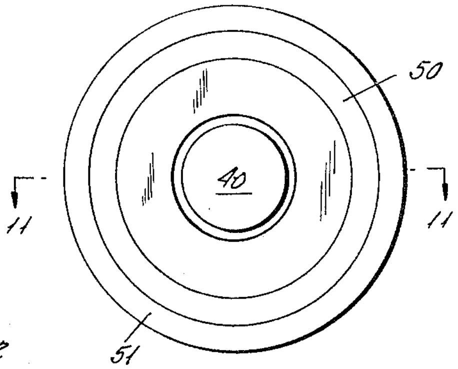
FIGURE 10 is a top view of the wafer of FIGURE 8 after an initial portion of the etching operation.

Thereafter, and as shown in FIGURES 10 and 11, the wafer is placed in a jig which will permit the etching of an annular opening 50 which extends through the junction 51. This jig can be formed in any desired manner and can, for example, have a first section, as indicated in dotted lines by the section 52, which covers the sides and bottom of the wafer and an outer annular rim of the wafer; and a second cap section 53 which covers an internal area of the top surface of the wafer. Thus, only an annular area on the outer surface is exposed to the action of an etch.

By way of illustration, the annular opening may have an internal diameter of the order of 560 mils and an outer diameter of the order of 620 mils. Thus, the annular channel will have a radial thickness of the order of 40 mils.

The wafer and jig are then immersed in an etching medium. A typical etching compound which can be used is comprised of three parts of nitric acid, one part of hydrofluoric acid, and one part of acetic acid. The first portion of the etching operation shown in FIGURE 11 is terminated after approximately 4 minutes with the annular opening 50 passing through junction 51.

Figure 13:
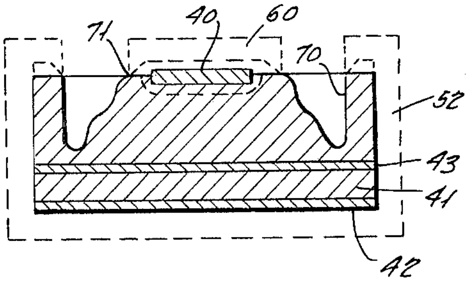
FIGURE 13 is a cross-sectional view of FIGURE 12 taken across the lines 13—13 in FIGURE 12.

Thereafter, and without removing the outer portion 52 of the jig, and as illustrated in FIGURE 13, the central portion 53 of the jig is removed and replaced by a second cap portion 60 which has a diameter of 425 mils. The assembly is then returned immediately to its etch bath for approximately 2½ minutes so that the etch continues to cut an annular channel having the shape shown, for example, in FIGURE 13. It will be noted that this latter etch is permitted to continue until just before the silicon wafer is completely cut through by the etch.

Figure 14:
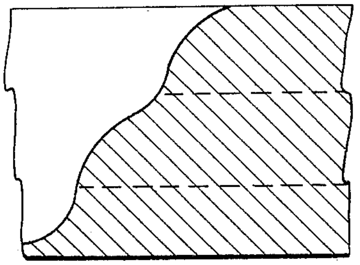
FIGURE 14 is an enlarged view of the sloping surface at the edge junction in FIGURE 13.

By replacing the masks during the etching operation, the shape of the cut through junction 51 is controlled in a novel manner and forms an angle at the junction 51 which is shown in more detail in FIGURE 14. This angle more specifically is preferably greater than 45° to the vertical. The formation of this angle has been found to be of great importance in the formation of high voltage junctions in that it acts to reduce electrical stresses across the junction.

Once this desired shape is obtained, the wafer is washed by immersing it in distilled water. The wafer can be further cleaned, if necessary, by immersing it in an etching compound for approximately 1 minute for pure cleaning purposes.

Thereafter, the wafer is coated with a varnish which fills the annular channel 70, and the excess is removed by centrifugal force. It is to be particularly noted that this etching operation and contouring operation is performed in a two-step single operation. By leaving the rim external to channel 70, and thereafter filling the channel with varnish, there is a finished device completely isolated from the lower metallic electrode surface. Moreover, the contouring operation is most important in the formation of the high voltage unit. It is to be specifically noted that while these steps have been shown in conjunction with a controlled rectifier, they could, of course, be applied to the formation of any device having any desired number of junctions.

Figure 12:
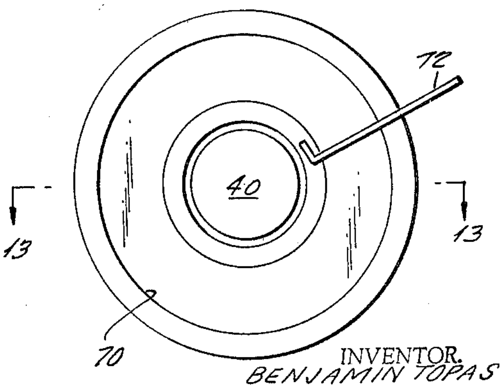
FIGURE 12 is a top view of the wafer of FIGURE 11 after the completion of the etching operation and schematically illustrates the placement of the Gate electrode.

After the formation of the completed wafer, as shown in FIGURE 13, a suitable gate electrode is connected to the annular surface 71, as schematically illustrated by the gate wire 72 in FIGURE 12, and a suitable cathode or emitter cable is connected to alloy plate 40 in any desired manner. The anode conductor is then suitably connected to the silver member 42. The complete unit is contained within a hermetically sealed housing in the usual manner.

As an unexpected advantage of the device formed as shown above, it has been found that these units have an extremely high *dV/dt* rating. Thus, whereas controlled rectifiers manufactured according to prior art techniques have had a *dV/dt* of 200 volts per microsecond, it has been found that the present units can operate on the *dV's/dt* equal to and in excess of 3,000 volts per microsecond. Accordingly, these units are ideally applicable for inverter circuit application along with their other usual switching applications. Moreover, the novel units manufactured in accordance with the present invention are the first units which are consistently capable of operation at the 1500 volt ratings.

Although this invention has been described with respect to its preferred embodiments, it should be understood that many variations and modifications will now be obvious to those skilled in the art, and it is preferred therefore that the scope of the invention be limited not by the specific disclosure herein but only by the appended claims.

The embodiments of the invention in which an exclusive privilege or property is claimed are defined as follows:

1. In a controlled rectifier; a wafer of silicon having a first and second planar junction therein and an epitaxially grown layer on one surface portion of said wafer forming a third junction; said one surface portion of said wafer being depressed below the surface of said wafer and forming a circular well centrally located in said wafer surface.

2. The device as set forth in claim 1 wherein an annular chamber surrounds said one surface portion and extends to a depth to intersect each of said first and second junctions.

3. The device substantially as set forth in claim 2 wherein said annular chamber has an outwardly sloping inner surface at the point at which it intersects the uppermost of said first and second junctions.

References Cited by the Examiner

UNITED STATES PATENTS

| | | | |
|---|---|---|---|
| 2,878,152 | 3/1959 | Runyan et al. | 148—33.5 |
| 2,895,858 | 7/1959 | Sangster | 148—175 |
| 3,000,768 | 9/1961 | Marinace | 148—175 |
| 3,008,089 | 11/1961 | Uhlir | 148—33.2 X |
| 3,025,192 | 3/1962 | Lowe | 148—33 |
| 3,057,762 | 10/1962 | Gans | 138—33.4 |
| 3,108,914 | 10/1963 | Hoerni | 148—33.5 X |

DAVID L. RECK, *Primary Examiner.*

N. F. MARKVA, C. N. LOVELL, *Assistant Examiners.*